(12) United States Patent
Jiang

(10) Patent No.: US 9,746,731 B2
(45) Date of Patent: Aug. 29, 2017

(54) ARRAY SUBSTRATE, REPAIRING SHEET, DISPLAY PANEL AND METHOD OF REPAIRING ARRAY SUBSTRATE

(71) Applicants: Boe Technology Group Co., Ltd., Beijing (CN); HEFEI XINSHENG OPTOELECTRONICS TECHNOLOGY CO., LTD., Anhui (CN)

(72) Inventor: Xuebing Jiang, Beijing (CN)

(73) Assignees: BOE TECHNOLOGY GROUP CO., LTD., Beijing (CN); HEFEI XINSHENG OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 71 days.

(21) Appl. No.: 14/786,187

(22) PCT Filed: May 13, 2015

(86) PCT No.: PCT/CN2015/078856
§ 371 (c)(1),
(2) Date: Oct. 22, 2015

(87) PCT Pub. No.: WO2016/086606
PCT Pub. Date: Jun. 9, 2016

(65) Prior Publication Data
US 2016/0342053 A1    Nov. 24, 2016

(30) Foreign Application Priority Data

Dec. 4, 2014 (CN) .......................... 2014 1 0735902

(51) Int. Cl.
*H01L 21/00* (2006.01)
*G02F 1/1362* (2006.01)
(Continued)

(52) U.S. Cl.
CPC ...... *G02F 1/136259* (2013.01); *G02F 1/1368* (2013.01); *G02F 1/13439* (2013.01);
(Continued)

(58) Field of Classification Search
CPC ......... G02F 2001/136263; G02F 1/309; G02F 1/136259
See application file for complete search history.

(56) References Cited

U.S. PATENT DOCUMENTS

2010/0214503 A1* 8/2010 Lee .................. G02F 1/136259
349/54
2014/0117370 A1* 5/2014 Ma ........................ H01L 27/124
257/72
2015/0277198 A1* 10/2015 Jia ........................ G02F 1/1309
257/773

FOREIGN PATENT DOCUMENTS

CN         101399272 A     4/2009
CN         101581865 A     11/2009
(Continued)

OTHER PUBLICATIONS

First Chinese Office Action, for Chinese Patent Application No. 201410735902.X, dated Sep. 5, 2016, 11 pages.
(Continued)

*Primary Examiner* — Selim Ahmed
*Assistant Examiner* — Evan Clinton
(74) *Attorney, Agent, or Firm* — Kinney & Lange, P.A.

(57) ABSTRACT

The present invention discloses an array substrate, comprising: a substrate; peripheral lines provided in a peripheral region of the substrate; an insulation layer provided over the peripheral lines and comprising through holes located at either side of a breakable portion of the peripheral line respectively; and conductive portions provided at the respective through holes of the insulation layer and electrically connected to the peripheral line through the through holes.
(Continued)

With the array substrate having the above configuration, when the peripheral line of the array substrate is broken, a repairing sheet can be spanned the conductive portions at either side of the broken portion, such that portions of the peripheral line on either side of the broken portion are electrically connected through the repairing sheet, thereby the broken portion of the peripheral line can be conveniently repaired so that the array substrate can be used normally. The present invention further provides a repairing sheet for the array substrate, a display panel comprising the array substrate and a method of repairing the array substrate.

18 Claims, 2 Drawing Sheets

(51) Int. Cl.
H01L 21/77 (2017.01)
H01L 27/12 (2006.01)
G02F 1/1333 (2006.01)
G02F 1/1335 (2006.01)
G02F 1/1343 (2006.01)
G02F 1/1368 (2006.01)
G02F 1/1345 (2006.01)

(52) U.S. Cl.
CPC .... *G02F 1/13452* (2013.01); *G02F 1/133345* (2013.01); *G02F 1/133514* (2013.01); *G02F 1/136286* (2013.01); *H01L 21/77* (2013.01); *H01L 27/12* (2013.01); *G02F 2001/133302* (2013.01); *G02F 2001/136263* (2013.01); *G02F 2001/136295* (2013.01); *G02F 2201/121* (2013.01); *G02F 2201/123* (2013.01); *G02F 2202/28* (2013.01)

(56) References Cited

FOREIGN PATENT DOCUMENTS

| CN | 101655640 A | 2/2010 | |
| CN | 101788729 * | 7/2010 | ............... G02F 1/13 |
| CN | 101788729 A | 7/2010 | |
| CN | 103293812 A | 9/2013 | |
| CN | 103353679 * | 10/2013 | ........... G02F 1/1309 |
| CN | 103353679 A | 10/2013 | |
| CN | 104375347 A | 2/2015 | |
| JP | 05232496 A | 9/1993 | |
| JP | 10170946 A | 6/1998 | |
| KR | 1020060086624 A | 8/2006 | |
| KR | 1020070037892 A | 4/2007 | |
| KR | 100734232 B1 | 7/2007 | |

OTHER PUBLICATIONS

The International Search Report mailed Aug. 19, 2015 for International Application No. PCT/CN2015/078856.
Second Chinese Office Action, for Chinese Patent Application No. 201410735902.X, dated Feb. 22, 2017, 7 pages.

* cited by examiner

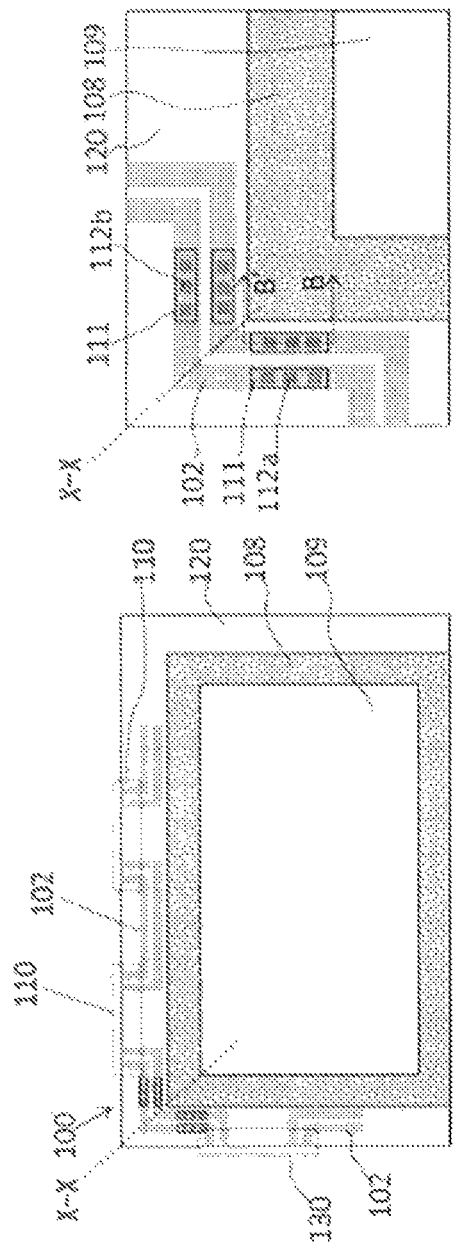
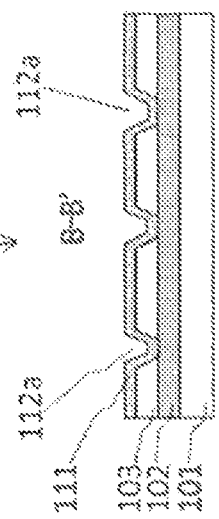

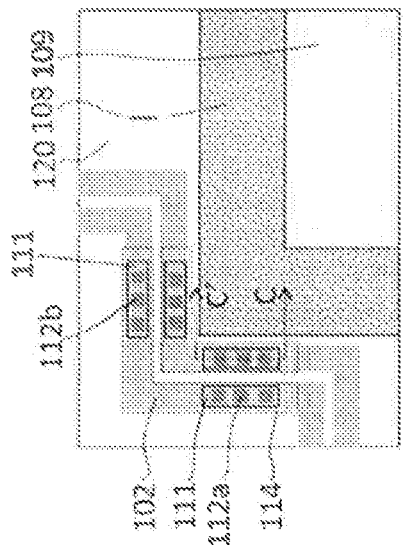
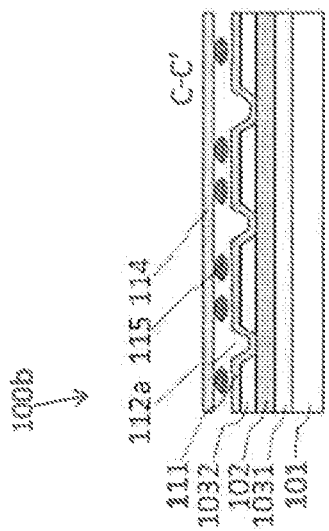
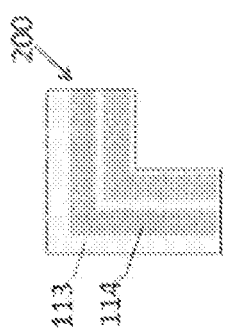
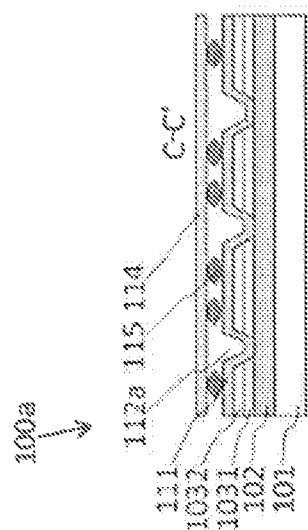

ARRAY SUBSTRATE, REPAIRING SHEET, DISPLAY PANEL AND METHOD OF REPAIRING ARRAY SUBSTRATE

CROSS-REFERENCE TO RELATED APPLICATION

This application is a Section 371 National Stage Application of International Application No. PCT/CN2015/078856, filed 13 May 2015, entitled "ARRAY SUBSTRATE, REPAIRING SHEET, DISPLAY PANEL AND METHOD OF REPAIRING ARRAY SUBSTRATE", which has not yet published, and which claims priority to Chinese Application No. 201410735902X, filed on 4 Dec. 2014, incorporated herein by reference in their entirety.

BACKGROUND OF THE INVENTION

Field of the Invention

Embodiments of the present disclosure generally relate to the field of display technologies, and particularly, to an array substrate for a display, a repairing sheet for the array substrate, a display panel comprising the array substrate and a method of repairing an array substrate.

Description of the Related Art

A TFT-LCD display panel mainly comprises a CF (color filter) substrate and a TFT (thin film transistor) array substrate, which are bonded at peripheries thereby using sealant during a bonding process so as to form a liquid crystal cell with liquid crystal sealed therein by the sealant. Generally, the TFT array substrate comprise a peripheral region located outside of the sealant and protruding from the CF substrate, the peripheral region is used for connecting source and gate drive chips and comprises peripheral lines for directing external electrical signals into the substrate, comprising various control signal and voltage wirings, for example, frame on-signal line STV, row on-signal line CPV, output on-signal line OE, gate on-voltage line VGH, gate off-voltage line VGL and the like.

Since the peripheral region of the array substrate is of a single-layer structure and exposed to outside, it will be prone to be impacted by external force, rubbed, scuffed during production and transportation, resulting in breaking of peripheral lines, especially easy occurrence of damages to edge and corner portions of the array substrate, and abnormal display of an display apparatus. This situation is especially serious in large-sized display panels. If these damages could not be repaired, this will cause a tremendous waste of resources for production. Therefore, there is a need to repair an array substrate where a peripheral line is broken.

SUMMARY

In view of the above problems, embodiments of the present disclosure provides an array substrate having a predesigned configuration, so that when a peripheral line of the array substrate is broken, a broken portion of the peripheral line can be repaired conveniently such that the array substrate can be normally used. The present disclosure further provides a repairing sheet for an array substrate, a display panel comprising the array substrate and a method of repairing an array substrate.

A first aspect of the present disclosure provides an array substrate, comprising: a substrate; peripheral lines provided in a peripheral region of the substrate; an insulation layer provided over the peripheral lines and comprising through holes located at either side of a breakable portion of the peripheral lines respectively; and conductive portions provided at the respective through holes of the insulation layer and electrically connected to the peripheral line through the through holes.

According to the array substrate provided in embodiments of the present disclosure, by means of the through holes provided in the insulation layer over the peripheral lines and conductive portions provided at respective through holes in the insulation layer, portions of the peripheral line on either side of the breakable portion (broken portion) are electrically conducted to a surface of the array substrate. Thus, when the peripheral line in the array substrate is broken, portions of the peripheral line on either side of the broken portion can be connected by a repairing sheet, thereby the broken peripheral line is repaired, so that the array substrate can be normally used.

According to one embodiment, the peripheral lines lead of from data lines in the array substrate.

According to one embodiment, another insulation layer is provided between the peripheral lines and the substrate.

According to one embodiment, the peripheral lines lead off from gate lines in the array substrate.

According to one embodiment, the insulation layer comprises a gate insulation layer and a passivation layer.

According to one embodiment, the conductive portions lead of from a pixel electrode layer.

According to one embodiment, the peripheral lines comprise signal lines for transmitting control signals or voltage lines of transmitting voltages.

According to a second aspect of the present disclosure, there is provided a repairing sheet for repairing the array substrate according to any one of the above embodiments. The repairing sheet comprises conductive lines shaped to conform to shapes of portions of the peripheral lines of the array substrate comprising the breakable portion; the repairing sheet is configured to be superposed on portions of the array substrate corresponding to the portion of the peripheral lines comprising the breakable portion when the breakable portion of the peripheral lines is broken so that the conductive lines of the repairing sheet are electrically connected to portions at either side of the broken portion of the peripheral line.

Thus, the broken peripheral line can be repaired conveniently by using the repairing sheet.

According to one embodiment, the repairing sheet is a flexible printed circuit board.

According to one embodiment, the repairing sheet is adhered to the array substrate by an anisotropic conductive adhesive tape doped with gold balls therein.

According to one embodiment, the repairing sheet is shaped to conform to a shape of a corner of the array substrate.

According to an embodiment of another aspect of the present disclosure, there is provided an array substrate assembly, comprising the array substrate of the above first aspect and the repairing sheet of the second aspect.

According to one embodiment, the array substrate assembly further comprises an anisotropic conductive adhesive tape doped with gold balls therein for adhering the repairing sheet to a broken portion of a peripheral structure of the array substrate.

According to a fourth aspect of the present disclosure, there is provided a method of repairing an array substrate, the array substrate comprising a substrate, peripheral lines provided in a peripheral region of the substrate and an insulation layer provided over the peripheral lines, the method comprising:

S1: forming through holes in the insulation layer through a patterning process at either side of a breakable portion of the peripheral lines respectively;

S2: forming conductive portions on the insulation layer formed with the through holes, the conductive portions being formed at least at the respective through holes so as to be electrically connected to the peripheral line through the through holes;

S3: manufacturing a repairing sheet comprising conductive lines shaped to conform to shapes of portions of the peripheral lines comprising breakable portions;

S4: superposing the repairing sheet on portions of the array substrate corresponding to the portions of the peripheral lines comprising broken portions, so that the conductive lines on the repairing sheet are electrically connected to portions at either side of the broken portions of the peripheral lines.

According to the above method, the broken peripheral line can be repaired conveniently.

According to one embodiment, the peripheral lines lead of from data lines in the array substrate and are formed while forming the data lines.

According to one embodiment, the peripheral lines lead off from gate lines in the array substrate and are formed while forming the gate lines.

According to one embodiment, the conductive portions lead of from pixel electrodes and are formed while forming the pixel electrodes.

According to one embodiment, the through holes for repairing the peripheral lines are formed while forming through holes in the array substrate for connecting gates and pixel electrodes or for connecting data lines and pixel electrodes.

According to one embodiment, the repairing sheet is a flexible printed circuit board.

According to one embodiment, the repairing sheet is adhered to a broken portion of a peripheral structure of the array substrate by an anisotropic conductive adhesive tape doped with gold balls therein.

A fourth aspect of the present disclosure provides a display panel, comprising the array substrate according to embodiments of the first aspect of the present disclosure and a color filter substrate assembled with the array substrate.

BRIEF DESCRIPTION OF THE DRAWINGS

FIG. 1 is a schematic diagram showing an array substrate according to one embodiment of the present disclosure;

FIG. 2 is an enlarged view of one corner of the array substrate of FIG. 1;

FIG. 3 is a partial cross sectional view of the array substrate taken along line BB' of FIG. 2;

FIG. 4 is a schematic diagram of a repairing sheet of one embodiment of the present disclosure;

FIG. 5 is an enlarged view of a corner of the array substrate connected with a repairing sheet, similar to FIG. 3;

FIG. 6 is a partial cross sectional view of the array substrate taken along line CC' of FIG. 5, according to one embodiment; and FIG. 7 is a partial cross sectional view of the array substrate taken along line CC' of FIG. 5, according to another embodiment.

DETAILED DESCRIPTION OF PREFERRED EMBODIMENTS

Hereinafter, specific implementations of the present disclosure will be further described in detail in conjunction with drawings and embodiments.

FIG. 1 is a plane schematic diagram showing an array substrate according to one embodiment of the present disclosure. As shown in FIG. 1, an array substrate 100 comprises a display region 109, a sealant region 108 and a peripheral region 120. The display region 109 corresponds to a portion of a display apparatus for displaying an image. The sealant region 108 corresponds to a portion to be bonded to a CF substrate. Peripheral lines 102 are provided within the peripheral region 120, for introducing control signals, voltage signals or the like from source and gate drive chips 110 and 130 into the array substrate 100.

Since the peripheral region 120 of the array substrate 100 will be exposed to outside of a glass substrate, it will be prone to be damaged due to external impaction, rubbing, scuffing or the like, resulting in breaking of peripheral lines 102. FIG. 2 schematically shows one corner of the array substrate 100 to be prone to damage. A portion of the corner indicated by broken line X-X is the more breakable portion, which hereinafter will be called as a breakable portion (or broken portion). When the peripheral line 102 is broken, the array substrate 100 can not be used normally.

Embodiments in FIGS. 1-3 provide a peripheral structure of the array substrate where the peripheral line is easily repaired when being broken. As shown in FIGS. 1-3, the array substrate 100 comprises: a glass substrate 101; peripheral lines 102 provided on the substrate 101, the peripheral lines 102 being located within the peripheral region 120 of the substrate 101, for introducing external electrical signals into the array substrate; an insulation layer 103 provided over the peripheral lines 102 and comprising through holes 112a and 112b located at either side of the breakable portion X-X of the peripheral line respectively; and conductive portions 111 provided at the respective through holes 112a and 112b in the insulation layer 103 and electrically connected to the peripheral lines 102 through the through holes.

For convenience of illustration, structures such as the insulation layer are not shown in FIGS. 1 and 2. FIG. 2 shows two peripheral lines 102 and the through holes 112a and 112b located at either side of the breakable portion X-X of each of the peripheral lines 102, and a portion of the peripheral line comprising the breakable portion X-X has an L shape. However, it will be obvious that the numbers and shapes of the peripheral lines and the through holes are not limited. In addition, FIGS. 1 and 2 show that the conductive portion 111 on each of sides of the breakable portion X-X covers three continuous through holes, and the conductive portions on both sides of the breakable portion X-X are not continuous. However, it will be obvious that the conductive portion 111 may cover each through holes, and the conductive portions on both sides of the breakable portion X-X may extend continuously.

FIG. 4 shows a repairing sheet 200 for repairing the array substrate 100 shown in FIG. 2. As shown in FIG. 4, the repairing sheet 200 comprises conductive lines 114 and an insulation layer 113 supporting the conductive lines 114. The conductive lines 114 may be copper lines, for example. The insulation layer 113 may be made of plastic, for example. As an example, the repairing sheet 200 may be a flexible printed circuit board. As shown in FIG. 4, a shape of each conductive line 114 conforms to that of the portion of the peripheral line comprising the breakable portion X-X shown in FIG. 2, that is, is formed into an L shape. A shape of the repairing sheet 200 also conforms to that of the corner of the array substrate 100, that is, is formed into an L shape. Further, sizes of the repairing sheet 200 correspond to those of the corner, wherein positions and sizes of the conductive lines 114 correspond to positions and sizes of the peripheral lines in the corner.

When the peripheral line 102 is broken along the breakable portion X-X in FIG. 2, the repairing sheet 200 shown in FIG. 4 may be superposed on the corner of the array substrate shown in FIG. 2, so that the conductive lines 114 of the repairing sheet 200 are arranged directly above the peripheral line 102. As such, portions of the peripheral line at either side of the broken portion X-X may be electrically conducted via the through holes 112a and 112b and the conductive portions 111 and via the repairing sheet 200 between the through holes 112a and 112b, thereby the array substrate can be repaired and used normally.

Specifically, the repairing sheet may be adhered to the damaged portions of the array substrate by an anisotropic conductive adhesive tape; for example, by a double-faced adhesive tape doped with gold balls therein. Thus, the damaged portions of the array substrate can be repaired conveniently.

FIG. 5 is an enlarged view of a corner of an array substrate similar to that shown in FIG. 3 but connected with a repairing sheet. FIG. 6 is a partial cross sectional view of the array substrate taken along line C-C' of FIG. 5, according to one exemplary embodiment. FIG. 7 is a partial cross sectional view of the array substrate taken along line C-C' of FIG. 5, according to another exemplary embodiment. For convenience of illustration, the insulation layer of the repairing sheet 200 is omitted from FIGS. 5-7.

According to one embodiment of the present disclosure, as shown in FIG. 6, the array substrate 100a comprises: a glass substrate 101; peripheral lines 102 provided on the substrate 101 and leading of from gate lines in the array substrate; a gate insulation layer 1031 provided on the peripheral lines 102 and the gate lines; a passivation layer 1032 provided on the gate insulation layer 1031; through holes 112a and 112b formed in each of the gate insulation layer 1031 and the passivation layer 1032 at either side of the breakable portion X-X of the peripheral line 102 respectively, the through holes in the gate insulation layer 1031 and in the passivation layer 1032 communicating with each other; and conductive portions 111 provided at respective through holes 112 in the gate insulation layer 1031 and passivation layer 1032, the conductive portions 111 may be parts of a transparent conductive layer provided on the passivation layer 1032. The transparent conductive layer father comprises a pixel electrode, for example.

Materials of the peripheral lines 102 and the gate lines may be metal such as Al, Cu or the like, the material of the transparent conductive layer may be Indium tin oxide (ITO), for example. The material of the gate insulation layer 1031 may be SiNx, SiO$_2$ or the like, and the material of the passivation layer 1032 may be SiNx, SiO$_2$ or the like.

In the embodiment shown in FIG. 6, the gate insulation layer 1031 and the passivation layer 1032 correspond to the insulation layer 103 shown in FIG. 3. Further, FIG. 6 shows the repairing sheet 200 superposed over the conductive portions 111, similar to FIG. 4. For convenience of illustration, only the conductive lines 114 of the repairing sheet 200 are shown in the figure. Moreover, FIG. 6 further shows conductive gold balls 115 for being electrically connected to the conductive portions 111 and the conductive lines 114.

FIG. 7 is a partial cross sectional view of the array substrate taken along line C-C' of FIG. 5, according to another exemplary embodiment. As shown in FIG. 7, the array substrate 100a comprises: a glass substrate 101; a gate insulation layer 1031 provided on the substrate 101; peripheral lines 102 provided on the gate insulation layer 1031 and leading of from data lines in the array substrate; a passivation layer 1032 provided on the data lines and the peripheral lines 102; through holes 112a and 112b formed in passivation layer 1032 at either side of the breakable portion X-X of the peripheral line 102 respectively; and conductive portions 111 provided at respective through holes 112a and 112b in the passivation layer 1032, the conductive portions 111 may be parts of a transparent conductive layer provided on the passivation layer 1032. The transparent conductive layer further comprises a pixel electrode, for example.

Materials of the peripheral lines 102 and the gate lines may be metal such as Al, Cu or the like, the material of the transparent conductive layer may be indium tin oxide (ITO), for example. The material of the gate insulation layer 1031 may be SiNx, SiO$_2$ or the like, and the material of the passivation layer 1032 may be SiNx, SiO$_2$ or the like.

In the embodiment shown in FIG. 7, the passivation layer 1032 corresponds to the insulation layer 103 shown in FIG. 3. Further, FIG. 7 shows the repairing sheet 200 superposed over the conductive portions 111, similar to FIG. 4. For convenience of illustration, only the conductive lines 114 of the repairing sheet 200 are shown in the figure. Moreover, FIG. 7 further shows conductive gold balls 115 for being electrically connected to the conductive portions 111 and the conductive lines 114.

It should be understood that FIGS. 6 and 7 only schematically show structures of peripheral portions of the array substrate. Further for convenience of illustration, description of other functional structures of the array substrate is omitted in the above embodiments. However, it should be understood by those skilled in the art that the array substrate further comprises structures such as TFTs, pixel electrodes, a common electrode, data lines and the like. In addition, although an example in which edge and corner portion of the array substrate are damaged is described in the embodiments, it is obvious that the concept of the present disclosure can be applied for repairing damages of other portions of the array substrate.

The array substrate of the above embodiments of the present disclosure may be combined with the a CF substrate so as to form a liquid crystal panel, for products or members having a display function, such as tablet computer, TV, display, notebook computer, digital photo frame and the like. Thus, embodiments of another aspect of the present disclosure provide a display panel, comprising the array substrate according to the above embodiments and a color filter substrate assembled with the array substrate. As described above, the peripheral lines in the array substrate can be easily repaired after being broken, thus maintainability of the display panel comprising the array substrate is improved.

Hereinafter, a method of repairing an array substrate according to one embodiment of the present disclosure will be described. The array substrate, for example, with reference to FIG. 3, comprises the substrate 101, the peripheral lines 102 provided in the peripheral region of the substrate 101 and the insulation layer 103 provided over the peripheral lines 102, the method comprises steps of:

S1: during manufacturing the array substrate, forming, after forming the insulation layer 103, through holes 112a and 112b in the insulation layer 103 through a patterning process at either side of the breakable portion X-X of the peripheral line 102 respectively. Specifically, photoresist may be coated on the insulation layer, and then the through holes are formed in the insulation layer through processes such as mask exposure, development, etching and the like.

S2: forming conductive portions 111 on the insulation layer 102 formed with the through holes 112a and 112b, the conductive portions 111 being formed at least at the respective through holes 112a and 112h so as to be electrically connected to the peripheral line 102 through the corresponding through holes. Specifically, a conductive layer such as ITO may be deposited on the insulation layer 103, then photoresist is coated, and the conductive portions 111 are formed in the insulation layer 103 by using processes such as mask exposure, development, etching and the like.

S3: manufacturing a repairing sheet comprising conductive lines shaped to conform to shapes of portions of the peripheral lines comprising breakable portions. For example, the L-shaped repairing sheet 200 shown in FIG. 4 may be manufactured, for being adhered to the corner of the array substrate shown in FIG. 2. Specifically, the repairing sheet may be manufacturing by using processes of manufacturing a flexible printed circuit board.

S4: superposing the repairing sheet on portions of the array substrate corresponding to the portions of the peripheral lines comprising a broken portion, so that the conductive lines on the repairing sheet are electrically connected to portions at either side of the broken portion of the peripheral line. Specifically, the repairing sheet may be adhered to the broken portion of the peripheral structure of the array substrate by an anisotropic conductive adhesive tape doped with gold balls therein.

The peripheral lines may lead off from gate lines in the array substrate, as shown in FIG. 6, and thus during manufacturing the array substrate, the peripheral lines may be formed while forming the gate lines.

Or, The peripheral lines may lead of from data lines in the array substrate, as shown in FIG. 7, and thus during manufacturing the array substrate, the peripheral lines may be formed while forming the data lines.

In addition, the conductive portions may lead of from pixel electrodes, and thus during manufacturing the array substrate, the conductive portions may be formed while forming the pixel electrodes. Therefore, it is not necessary to add a particular process of depositing conductive portions above the peripheral lines.

Further, the through holes for repairing the peripheral lines may be formed while forming through holes in the array substrate far connecting gates and pixel electrodes or for connecting data lines and pixel electrodes. Thus, it is not necessary to add a particular process of depositing through holes far repairing the peripheral lines.

Therefore, the method of repairing the array substrate provided according to embodiments of the present disclosure can be used to convenient repairing broken portions of the peripheral lines in the array substrate, without adding excessive steps.

Several exemplary embodiments of the present disclosure have been described above. However, it would be appreciated the embodiments are only intended to illustrate concepts of the present invention, but not to limit the scopes of the present invention. Further, in the above detailed description, for purposes of explanation, numerous specific details are set forth in order to provide a thorough understanding of the disclosed embodiments. It will be apparent, however, that one or more embodiments may be practiced without these specific details. On the other hand, the embodiment may comprise other well-known structures and devices, and the expression "on . . . ", "over . . . ", or "above . . . " does not necessarily represent direct contact. Thus, various changes and modifications may be made by those skilled in the art in these embodiments, and technique solutions defined by the changes and modifications belong to the scopes of the invention. The scopes of the present invention are defined in the claims.

What is claimed is:

1. An array substrate, comprising:
a substrate;
peripheral lines provided in a peripheral region of the substrate;
an insulation layer provided over the peripheral lines and comprising through holes located at either side of a breakable portion of the peripheral lines respectively; and
conductive portions provided at the respective through holes of the insulation layer and electrically connected to the peripheral lines through the through holes;
wherein the array substrate is adhered by an anisotropic conductive adhesive tape doped with gold balls therein.

2. The array substrate according to claim 1, wherein the peripheral lines lead off from data lines in the array substrate.

3. The array substrate according to claim 2, wherein another insulation layer is provided between the peripheral lines and the substrate.

4. The array substrate according to claim 1, wherein the peripheral lines lead off from gate lines in the array substrate.

5. The array substrate according to claim 4, wherein the insulation layer comprises a gate insulation layer and a passivation layer.

6. The array substrate according to claim 1, wherein the conductive portions lead off from a pixel electrode layer.

7. The array substrate according to claim 1, wherein the peripheral lines comprise signal lines for transmitting control signals or voltage lines of transmitting voltages.

8. A repairing sheet for repairing the array substrate according to claim 1, comprising conductive lines shaped to conform to shapes of portions of the peripheral lines of the array substrate comprising the breakable portion; the repairing sheet is configured to be superposed on portions of the array substrate corresponding to the portions of the peripheral lines comprising the breakable portion when the breakable portion of the peripheral lines is broken so that the conductive lines of the repairing sheet are electrically connected to portions at either side of the broken portion of the peripheral lines; wherein the repairing sheet is adhered to the array substrate by the anisotropic conductive adhesive tape doped with gold balls therein.

9. The repairing sheet according to claim 8, wherein the repairing sheet is a flexible printed circuit board.

10. The repairing sheet according to claim 8, wherein the repairing sheet is shaped to conform to a shape of a corner of the array substrate.

11. An array substrate assembly, comprising the array substrate according to claim 1 and the repairing sheet according to claim 8.

12. The array substrate assembly according to claim 11, wherein the anisotropic conductive adhesive tape doped with gold balls therein is for adhering the repairing sheet to a broken portion of a peripheral structure of the array substrate.

13. A display panel, comprising: the array substrate according to claim 1 and a color filter substrate assembled with the array substrate.

14. A method of repairing an array substrate, the array substrate comprising a substrate, peripheral lines provided in a peripheral region of the substrate and an insulation layer provided over the peripheral lines, the method comprising:

S1: forming through holes in the insulation layer through a patterning process at either side of a breakable portion of the peripheral lines respectively;

S2: forming conductive portions on the insulation layer formed with the through holes, the conductive portions being formed at least at the respective through holes so as to be electrically connected to the peripheral lines through the through holes;

S3: manufacturing a repairing sheet comprising conductive lines shaped to conform to shapes of portions of the peripheral lines comprising the breakable portion;

S4: superposing the repairing sheet on portions of the array substrate corresponding to the portions of the peripheral lines comprising broken portions, so that the conductive lines on the repairing sheet are electrically connected to portions at either side of the broken portion of the peripheral lines;

wherein the repairing sheet is adhered to a broken portion of a peripheral structure of the array substrate by an anisotropic conductive adhesive tape doped with gold balls therein.

15. The method according to claim 14, wherein:

the peripheral lines lead off from data lines in the array substrate and are formed while forming the data lines; or the peripheral lines lead off from gate lines in the array substrate and are formed while forming the gate lines.

16. The method according to claim 14, wherein:

the conductive portions lead off from pixel electrodes and are formed while forming the pixel electrodes.

17. The method according to claim 14, wherein:

the through holes for repairing the peripheral lines are formed while forming through holes in the array substrate for connecting gates and pixel electrodes or for connecting data lines and pixel electrodes.

18. The method according to claim 14, wherein:

the repairing sheet is a flexible printed circuit board.

\* \* \* \* \*

UNITED STATES PATENT AND TRADEMARK OFFICE
CERTIFICATE OF CORRECTION

PATENT NO.      : 9,746,731 B2
APPLICATION NO. : 14/786187
DATED           : August 29, 2017
INVENTOR(S)     : Xuebing Jiang It is certified that error appears in the above-identified patent and that said Letters Patent is hereby corrected as shown below:

In the Specification

Column 2, Line 17:
Delete "of"
Insert --off--

Column 2, Line 26:
Delete "of"
Insert --off--

Column 3, Line 19:
Delete "of"
Insert --off--

Column 3, Line 25:
Delete "of"
Insert --off--

Column 3, Line 50:
Delete "BB"
Insert --B-B--

Column 3, Line 56:
Delete "CC"
Insert --C-C--

Column 5, Line 32:
Delete "of"
Insert --off--

Signed and Sealed this
Tenth Day of April, 2018

Andrei Iancu
*Director of the United States Patent and Trademark Office*

CERTIFICATE OF CORRECTION (continued)
U.S. Pat. No. 9,746,731 B2

Column 5, Line 47:
Delete "father"
Insert --farther--

Column 7, Line 4:
Delete "112h"
Insert --112b--

Column 7, Line 38:
Delete "of"
Insert --off--

Column 7, Line 44:
Delete "far"
Insert --for--

Column 7, Line 47:
Delete "far"
Insert --for--